United States Patent
Sasaki et al.

(10) Patent No.: US 9,327,880 B2
(45) Date of Patent: *May 3, 2016

(54) COVER FILM

(75) Inventors: Akira Sasaki, Isesaki (JP); Hisatsugu Tokunaga, Isesaki (JP); Tetsuo Fujimura, Isesaki (JP)

(73) Assignee: DENKA COMPANY LIMITED, Tokyo (JP)

( * ) Notice: Subject to any disclaimer, the term of this patent is extended or adjusted under 35 U.S.C. 154(b) by 136 days.

This patent is subject to a terminal disclaimer.

(21) Appl. No.: 14/123,864

(22) PCT Filed: May 29, 2012

(86) PCT No.: PCT/JP2012/063766
§ 371 (c)(1),
(2), (4) Date: Jan. 8, 2014

(87) PCT Pub. No.: WO2012/169387
PCT Pub. Date: Dec. 13, 2012

(65) Prior Publication Data
US 2014/0116921 A1    May 1, 2014

(30) Foreign Application Priority Data
Jun. 8, 2011 (JP) .................. 2011-127953

(51) Int. Cl.
| B32B 27/34 | (2006.01) |
| B32B 27/08 | (2006.01) |
| B32B 7/06 | (2006.01) |
| B32B 27/20 | (2006.01) |
| B32B 27/30 | (2006.01) |
| B32B 27/32 | (2006.01) |
| B65D 43/02 | (2006.01) |
| H05K 13/00 | (2006.01) |

(52) U.S. Cl.
CPC . B65D 43/02 (2013.01); B32B 7/06 (2013.01); B32B 27/08 (2013.01); B32B 27/20 (2013.01); B32B 27/302 (2013.01); B32B 27/327 (2013.01); B32B 27/34 (2013.01); H05K 13/0084 (2013.01); B32B 2250/24 (2013.01); B32B 2264/102 (2013.01); B32B 2307/202 (2013.01); B32B 2307/31 (2013.01); B32B 2307/518 (2013.01); B32B 2307/5825 (2013.01); B32B 2307/748 (2013.01); B32B 2435/00 (2013.01); B32B 2435/02 (2013.01); B32B 2439/40 (2013.01); B32B 2553/00 (2013.01); Y10T 428/1405 (2015.01); Y10T 428/1452 (2015.01); Y10T 428/2826 (2015.01)

(58) Field of Classification Search
None
See application file for complete search history.

(56) References Cited

U.S. PATENT DOCUMENTS

| 2003/0017328 A1 | 1/2003 | Inoue et al. |
| 2006/0199005 A1 | 9/2006 | Fuji et al. |
| 2010/0266826 A1* | 10/2010 | Yonezawa ..................... 428/216 |
| 2012/0003429 A1 | 1/2012 | Iwasaki et al. |

FOREIGN PATENT DOCUMENTS

| JP | A-4-279466 | 10/1992 |
| JP | A-7-223674 | 8/1995 |
| JP | A-8-39740 | 2/1996 |
| JP | A-2002-283512 | 10/2002 |
| JP | A-2006-327624 | 12/2006 |
| WO | WO 2004/094258 A1 | 11/2004 |
| WO | WO 2010/104010 A1 | 9/2010 |

OTHER PUBLICATIONS

Sep. 4, 2012 International Search Report issued in International Application No. PCT/JP2012/063766.
Mar. 25, 2015 Search Report issued in European Patent Application No. 12796948.3.

* cited by examiner

*Primary Examiner* — Sheeba Ahmed
(74) *Attorney, Agent, or Firm* — Oliff PLC

(57) ABSTRACT

Disclosed is a cover film and an electronic component package that uses the cover film as a lid material for a thermoplastic resin carrier tape, the cover film having at least a substrate layer, an intermediate layer, and a heat sealing layer having a thermoplastic resin which can be heat-sealed to a carrier tape, the intermediate layer including a metallocene straight-chain low density polyethylene, the metallocene straight-chain low density polyethylene having a TMA softening temperature of 90 to 109 ° C. according to JIS K7196, and the cover film in some instances having a release layer between the intermediate layer and the heat sealing layer.

6 Claims, 1 Drawing Sheet

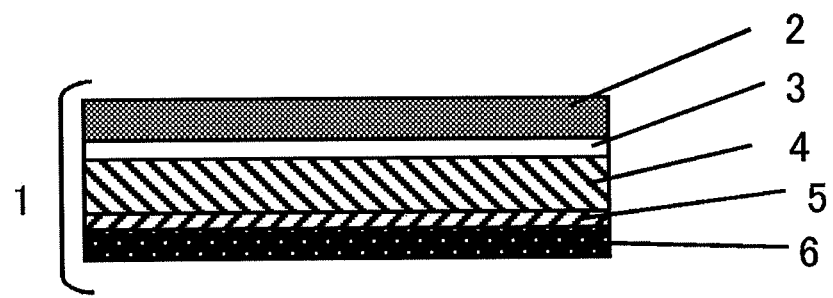

COVER FILM

TECHNICAL FIELD

The present invention relates to a cover film used in packages for electronic components.

BACKGROUND ART

With the miniaturization of electronic devices, the electronic components used therein have also become progressively smaller and of higher performance, in addition to which the components are automatically mounted on printed circuit boards during assembly of the electronic devices. Surface-mounted electronic components are housed in carrier tape with receiving pockets that are successively formed by embossing in accordance with the shapes of the electronic components. After loading the electronic components into the receiving pockets, a cover film is laid as a lid material over the top surface of the carrier tape, and the ends of the cover film are continuously heat-sealed in the longitudinal direction with a heated seal bar to form packages of electronic components. As cover film materials, those having a heat seal layer of thermoplastic resin laminated onto a substrate of biaxially stretched polyester film are used.

In recent years, there have been advances in miniaturization, weight reduction and thinning of various electronic components such as capacitors, resistors, ICs, LEDs, connectors and switching elements, such that if the difference between the maximum value and the minimum value, i.e. the "range", of the peel strength when peeling the cover film is large, then the carrier tape can vibrate violently, causing the electronic components to spill out and resulting in mounting errors. Additionally, with sudden increases in mounting speed, the peeling rate of cover films has greatly increased to 0.1 seconds or less per tact, so that large impact stresses are applied to the cover film during peeling. As a result, when the peel strength is too high, the cover film may rupture.

As methods of reducing variations in peel strength of the cover film, a method of patterning the heat seal layer into islands and a method of mixing an incompatible resin into the intermediate layer or the heat seal layer to cause cohesive failure in the layer have been proposed (see, e.g., Patent Documents 1 and 2). However, the miniaturization of electronic components has placed higher demands to reduce variations in peel strength, so there are cases in which the required performance cannot be satisfied even by such methods.

Additionally, a method of suppressing variations in peel strength by limiting the softening temperature of the resin used in the intermediate layer (see, e.g., Patent Document 3) and a method of using a metallocene linear low-density polyethylene (LLDPE) of a particular specific weight as the intermediate layer to form a layer with a low Young's modulus as the adhesive layer between the intermediate layer and the substrate layer, thereby preventing the propagation of stresses to the substrate layer (see Patent Document 4) have been proposed. However, even when using these methods, it is difficult to adequately suppress film ruptures when peeling the cover film from the carrier tape at high speed.

Patent Document 1: JP H7-223674 A
Patent Document 2: JP H4-279466 A
Patent Document 3: WO 2004/094258 A
Patent Document 4: JP 2006-327624 A

SUMMARY OF THE INVENTION

The present invention addresses the problem of offering a cover film that, when heat sealed to a carrier tape of plastic such as a polystyrene or polycarbonate, has an appropriate degree of peel strength and sufficiently little variation in peel strength, so that tape rupture does not occur even due to the impact of high-speed peeling.

As a result of diligent study of the aforementioned problem, the present inventors discovered that a cover film capable of solving the problem can be obtained by using an intermediate layer comprising a m-LLDPE having a specific softening temperature, thereby achieving the present invention.

In other words, in one aspect, the present invention relates to a cover film comprising at least a substrate layer (A), an intermediate layer (B), and a heat seal layer (C) comprising a thermoplastic resin capable of heat sealing to carrier tape, wherein the intermediate layer (B) comprises a metallocene linear low-density polyethylene, wherein the metallocene linear low-density polyethylene has a softening temperature of 98 to 109° C. by a TMA method according to JIS K7196. Here, the cover film preferably comprises a peel layer (D) between the intermediate layer (B) and the heat seal layer (C), wherein one of the heat seal layer (C) and the peel layer (D) comprises a conductive material.

The peel layer (D) preferably comprises a hydrogenated aromatic vinyl-conjugated diene copolymer resin which has an aromatic vinyl group content of 15 to 35 mass % with respect to 100 mass % for the entire resin, and a density of $0.890 \times 10^3$ to $0.935 \times 10^3$ (kg/m$^3$). Additionally, the conductive material should preferably be conductive microparticles, in the form of either acicular or spherical microparticles, or a combination thereof.

Furthermore, in another aspect, the present invention also relates to an electronic component package using the above-described cover film as a lid material for a thermoplastic resin carrier tape.

The cover film of the present invention excels in heat sealability with respect to carrier tapes of plastic such as polystyrene and polycarbonate, has little variation in peel strength when peeling the cover film, and does not undergo tape rupture even from the impact of high-speed peeling.

BRIEF DESCRIPTION OF THE DRAWINGS

[FIG. 1] A schematic section view showing a layer arrangement of a cover film according to an embodiment of the present invention.

MODES FOR CARRYING OUT THE INVENTION

The cover film of the present invention essentially has at least a substrate layer (A), an intermediate layer (B) and a heat seal layer (C), and may in some cases also have a peel layer (D). An example of the laminar structure of the cover film of the present invention is shown in FIG. 1. As is clear therefrom, the cover film 1 has a laminar structure comprising a substrate layer 2, an intermediate layer 4 laminated over the substrate layer 2 with an anchor coat layer 3 in between, and a peel layer 5 and heat seal layer 6 sequentially laminated onto the intermediate layer 4.

Herebelow, each layer will be explained in detail.

<Substrate Layer (A)>

The substrate layer (A) is a layer comprising a biaxially stretched polyester or a biaxially stretched nylon, among which biaxially stretched polyethylene terephthalate (PET), biaxially stretched polyethylene naphthalate (PEN), biaxially stretched 6,6-nylon and 6-nylon are particularly favorable for use. The biaxially stretched PET, biaxially stretched PEN and biaxially stretched 6,6-nylon and 6-nylon may be those that are normally used, may be coated or infused with an antistatic agent for an anti-static treatment, or may be subjected to a corona treatment or an easy adhesion treatment. If the substrate layer (A) is too thin, the cover film itself may have reduced tensile strength, causing "film rupture" when the cover film is peeled. On the other hand, if too thick, not only is the heat sealability with respect to carrier tape reduced, but also, the cost increases, so the thickness should preferably be 12 to 25 μm.

<Intermediate Layer (B)>

In the present invention, the intermediate layer (B) is provided by laminating over one surface of the substrate layer (A), intermediated by an adhesive layer if necessary. The resin constituting the intermediate layer (B) may be a linear low-density polyethylene (hereinafter referred to as LLDPE) which is particularly flexible, has a suitable degree of rigidity and excels in tear strength at normal temperature. By using a resin with a density from 0.900 to 0.925 ($\times 10^3$ kg/m$^3$) in particular, the heat and pressure of heat sealing will not tend to cause the intermediate layer resin to bulge out from the end portion of the cover film, thereby making gunk to occur on the iron during heat sealing, and furthermore, softening of the intermediate layer when heat sealing the cover film will reduce contact irregularities of the heat sealing iron, making it easier to obtain stable peel strength when peeling the cover film.

While LLDPEs include those polymerized by Ziegler catalysts and those polymerized by metallocene catalysts (hereinafter referred to as m-LLDPEs), m-LLDPEs have an exceptionally high tear strength due to their tightly controlled molecular weight distribution. Therefore, in the present invention, the intermediate layer (B) is formed of m-LLDPE. Additionally, the m-LLDPE of the intermediate layer (B) in the present invention is chosen as one having a softening temperature of 98 to 110° C. by TMA according to JIS K7196. At less than 98° C., the intermediate layer (B) cannot completely absorb the impact during high-speed peeling and the frequency of film rupture increases, while at more than 110° C., the intermediate layer (B) is not adequately softened during heat sealing, so a stable peel strength cannot be achieved.

The m-LLDPEs having the above-described softening temperatures are available on the market, in the form of copolymers having, as comonomers, an ethylene and an olefin having at least 3 carbon atoms, preferably a linear, branched or aromatic nucleus-substituted α-olefin having 3 to 18 carbon atoms. Examples of linear mono-olefins include propylene, 1-butene, 1-pentene, 1-hexene, 1-octene, 1-nonene, 1-decene, 1-dodecene, 1-tetradecene, 1-hexadecene and 1-octadecene. Additionally, examples of branched mono-olefins include 3-methyl-1-butene, 3-methyl-1-pentene, 4-methyl-1-pentene and 2-ethyl-1-hexene. Additionally, examples of aromatic nucleus-substituted mono-olefins include styrene. These comonomers may be copolymerized with ethylenes either singly or as a combination of two or more types. This copolymerization may include copolymerization with polyenes such as butadiene, isoprene, 1,3-hexadiene, dicyclopentadiene and 5-ethylidene-2-norbornene.

The thickness of the intermediate layer (B) is generally 5 to 50 μm, preferably 10 to 40 μm. If the thickness of the intermediate layer (B) is less than 5 μm, the adhesive strength between the substrate layer (A) and the intermediate layer (B) may be insufficient, and the effect of reducing contact irregularities of the heat sealing iron when heat sealing a cover film onto the carrier tape may not be obtained. On the other hand, if more than 50 μm, the overall thickness of the cover film becomes too thick, making it difficult to obtain sufficient peel strength when heat sealing the cover film to the carrier tape.

<Heat Seal Layer (C)>

The cover film of the present invention has a heat seal layer (C) on the surface of the intermediate layer (B). Examples of the thermoplastic resin of the heat seal layer (C) include acrylic resins, polyester resins, styrenic resins and ethylene-vinyl acetate copolymer resins. Of these, acrylic resins have exceptional heat sealability with respect to polystyrenes and polycarbonates which are resins that constitute carrier tapes. In particular, the use of resins having a glass transition temperature from 45 to 80° C. is preferable for achieving a stable peel strength, and acrylic resins from 50 to 75° C. are more preferred.

The acrylic resin constituting the heat seal layer (C) may be a resin comprising at least 50 mass % of at least one type of acryl residue, including acrylic acid esters such as methyl acrylate, ethyl acrylate, propyl acrylate and butyl acrylate, and methacrylic acid esters such as methyl methacrylate, ethyl methacrylate, propyl methacrylate, butyl methacrylate and cyclohexyl methacrylate, or resins obtained by copolymerizing two or more of the above.

The thickness of the heat seal layer (C) should be from 0.1 to 5 μm, preferably 0.1 to 3 μm, and more preferably 0.1 to 0.5 μm. If the thickness of the heat seal layer is less than 0.1 μm, the heat seal layer (C) may not exhibit sufficient peel strength. On the other hand, if the thickness of the heat seal layer exceeds 5 μm, the cost will increase, and there may be variations in the peel strength when peeling the cover film.

<Peel Layer (D)>

The cover film of the present invention should preferably comprise a peel layer (D) of a thermoplastic resin between the intermediate layer (B) and the heat seal layer (C) for the purpose of reducing the range when peeling the cover film from the carrier tape. The thermoplastic resin used in this peel layer (D) should preferably be a hydrogenated aromatic vinyl-conjugated diene copolymer resin having an aromatic vinyl group content of 15 to 35 mass %. The density of the resin of the peel layer (D) should preferably be from $0.890 \times 10^3$ to $0.935 \times 10^3$ (kg/m$^3$), and the mass-average molecular weight should be between 50,000 and 200,000. Outside these values, the peel strength may not be sufficient, and the range may be too large when peeling.

The thickness of the peel layer (D) is normally from 0.1 to 3 μm, preferably 0.1 to 1.5 μm. When the thickness of the peel layer (D) is less than 0.1 μm, there may not be sufficient peel strength when heat sealing the carrier tape to a cover film. On the other hand, if the thickness of the peel layer (D) exceeds 3 μm, there may be variations in peel strength when peeling the cover film. As described below, the peel layer (D) and the heat seal layer (C) are normally formed by coating. The "thickness" when formed by coating is the thickness after drying.

<Additive Materials>

The peel layer (D) or the heat seal layer (C) may contain, as a conductive material, at least one of conductive tin oxide particles, conductive zinc oxide particles and conductive titanium oxide particles which are conductive fillers. Among these, the use of a tin oxide doped with antimony, phosphorus or gallium is preferred for improving the conductivity and having little decrease in transparency. The conductive tin oxide particles, conductive zinc oxide particles and conductive titanium oxide particles may be spherical or acicular. In particular, when using antimony-doped acicular tin oxide, a cover film having particularly good anti-static properties is obtained. The amount added is usually 100 to 1000 parts by mass, preferably 200 to 800 parts by mass with respect to 100 parts by mass of the thermoplastic resin constituting the peel layer (D). If the amount of conductive particles added is less than 100 parts by mass, the surface resistance on the heat seal layer (C) side of the cover film may not be less than $10^{12}\Omega$, and if more than 1000 parts by mass, the relative amount of thermoplastic resin decreases, making it difficult to obtain sufficient peel strength due to the heat seal.

On the other hand, at least one carbon nano-material such as carbon nanotubes and carbon nanofibers may be contained as a conductive material. Among these, carbon nanotubes having an aspect ratio of 10 to 10,000 are preferable. The amount added to the peel layer (D) is preferably 0.5 to 15 parts by mass, more preferably 3 to 10 parts by mass with respect to 100 parts by mass of the thermoplastic resin constituting the layer. If the amount added is less than 0.5 parts by mass, then the effect of providing conductivity by adding carbon nano-materials may be insufficient, whereas if the amount exceeds 15 parts by mass, the cost may increase, and reduced transparency of the cover film may make it difficult to inspect the housed components through the cover film.

The cover film of the present invention may be baked for 72 hours in a 60° C. environment or for 24 hours in an 80° C. environment while heat-sealed to the surface of carrier tape containing electronic components as mentioned above, in order to remove moisture contained in the sealed resin. In such a case, if the contained electronic components adhere to the cover film, there will be trouble in the process of peeling the cover film and mounting the electronic components. As described above, the cover film of the present invention has little variation in peel strength when peeling the cover film, and the stickiness of the heat seal layer (C) to contained electronic components when stored at high temperatures such as 60 to 80° C. can be controlled, but in order to more reliably prevent adhesion, an inorganic filler should preferably be added to the heat seal layer (C).

The inorganic filler that is added is an inorganic filler such as spherical or crushed talc particles, silica particles, alumina particles, mica particles, calcium carbonate or magnesium carbonate. In particular, silica particles can be more favorably used because they can easily achieve the particle sizes required by the present application, have good dispersibility, and have little loss of transparency when added to the heat seal layer (C). In particular, silica microparticles that have been surface treated with at least one type of aliphatic oxide-modified polysiloxane chosen from among propylene oxide-modified polysiloxanes or ethylene oxide-modified polysiloxanes are more preferred. By treating the surfaces of inorganic fillers with these polysiloxanes, the closeness of contact between the resin constituting the heat seal layer (C) and the inorganic filler can be increased, thereby improving the mechanical strength of the heat seal layer (C) and providing stable peel strength when peeling the cover film from the carrier tape.

The aforementioned inorganic fillers may be added in an amount of 10 to 50 parts by mass of inorganic fillers with a median size (D50) of less than 50 nm and 20 to 60 parts by mass of inorganic fillers with a median size (D50) of 50 to 300 nm, with respect to 100 parts by mass of the thermoplastic resin constituting the heat seal layer (C). By including inorganic fillers of these particle sizes in the heat seal layer (C), blocking can be suppressed when winding the cover film, and adhesion to the cover film can be inhibited even when the package housing the electronic components is stored in a high temperature environment. Additionally, by adding fillers of different particle sizes, reduced transparency of the cover film can be avoided in addition to the adhesion suppression effect on the housed components mentioned above, thereby enabling easy inspection of printing on the electronic components housed in the carrier tape and bent leads of the electronic components.

<Cover Film>

The method for producing the cover film of the present invention is not particularly restricted, and any common method may be used. For example, an adhesive of polyurethane, polyester, polyolefin or polyethyleneimine can be coated onto the surface of a substrate layer (A), for example, of a biaxially stretched polyester film, then a resin composition mainly composed of m-LLDPE to form an intermediate layer (B) can be extruded from a T-die, and coated onto a surface to which an anchor coating has been applied, to form a two-layer film consisting of a substrate layer (A) and an intermediate layer (B). Then, the surface of the intermediate layer (B) may be coated with the peel layer (D) of the present invention, for example, by coating with a gravure coater, a reverse coater, a kiss coater, an air knife coater, a Mayer bar coater or a dip coater. In that case, the surface of the intermediate layer (B) should preferably be subjected to a corona treatment or ozone treatment before coating, of which a corona treatment is particularly preferred. Further, the peel layer (D) coated with the intermediate layer (B) may be coated with a resin composition constituting the heat seal layer (C), for example, by coating with a gravure coater, a reverse coater, a kiss coater, an air knife coater, a Mayer bar coater or a dip coater, to obtain the objective cover film.

As another method, the intermediate layer (B) can be preformed by T-die casting or inflation, then dry-laminated onto the substrate layer (A), for example, of a biaxially stretched polyester film by adhesion using a polyurethane, polyester or polyolefin adhesive to obtain a film consisting of a substrate layer (A) and an intermediate layer (B), and then the surface of the intermediate layer coated with the peel layer (D) and the heat seal layer (C) to obtain the desired cover film.

As yet another method, the desired cover film can also be obtained by sand lamination. In other words, a film constituting the intermediate layer (B) (intermediate layer 1) is formed by T-die casting or inflation. Next, a resin composition mainly composed of melted m-LLDPE is supplied between a film of this intermediate layer 1 and a film of the substrate layer (A) to form and laminate an intermediate layer 2, and after obtaining a film composed of the substrate layer (A) of the desired cover film and an intermediate layer (B) consisting of the intermediate layer 1 and the intermediate layer 2, a peel layer (D) and a heat seal layer (C) are further coated onto the surface on the intermediate layer side to obtain the objective film. In this method, as with the above methods, an adhesive should generally be coated onto the surface on the side of the substrate layer (A) film to be laminated.

In addition to the aforementioned steps, at least one surface of the cover film may be subjected to an antistatic treatment as needed. As the antistatic agent, an anionic, cationic, non-ionic or betaine surfactant type antistatic agent, or a polymer type antistatic agent and a conductive material may be applied using a roll coater with a gravure roller, a lip coater or a sprayer. Additionally, in order to evenly apply the antistatic agent, the film surface should preferably be subjected to a corona discharge treatment or an ozone treatment, preferably a corona discharge treatment, before performing the antistatic treatment.

<Carrier Tape>

The cover film is used as a lid material for the carrier tape which is a receptacle for housing electronic components. Carrier tape is a strip-shaped material with a width of about 8 mm to 100 mm having dimples for housing electronic components. When heat sealing a cover film as a lid material, the material constituting the carrier tape is not particularly restricted, and any type that is commercially available may be used, such as polystyrenes, polyesters, polycarbonates or polyvinyl chlorides. The carrier tape may be made conductive by kneading carbon black or carbon nanotubes into the resin, may have an anti-static agent or a conductive filler kneaded in, or may have a surface coated with a coating having a surfactant type antistatic agent or a conductive material such as a polypyrrole or a polythiophene dispersed in an organic binder of acrylic or the like to provide an antistatic property.

<Electronic Component Package>

A package housing electronic components can, for example, be formed by placing the electronic components in the portions in a carrier tape for housing electronic components, then using a cover film as a lid material by continuously heat sealing both edges of the cover film in the longitudinal direction to form a package, and winding the result into a reel. By packaging the electronic components in this form, they can be stored and transported. The package housing the electronic components is advanced using holes called sprocket holes for conveying carrier tape provided in the longitudinal direction at the edges of the carrier tape while successively peeling away the cover film, verifying the presence, orientation and position of the electronic components, extracting, and mounting them onto a substrate using a component mounting device.

Furthermore, when peeling away the cover film, if the peel strength is too low, it may come loose from the carrier tape and cause the housed components to spill out, and if too high, the cover film can become difficult to peel away from the carrier tape and become torn when peeling, so when heat sealed at 120 to 220° C., it should have a peel strength of 0.05 to 1.0 N.

EXAMPLES

Herebelow, the present invention will be described in detail with reference to examples, but the present invention is not to be construed as being limited thereby. In the examples and comparative examples, the following resin materials were used in the intermediate layer (B), the peel layer (D) and the heat seal layer (C).

(Resin of the Intermediate Layer (B))
(b-1) m-LLDPE: LL-UL (Futamura Chemical), thickness 40 μm, TMA softening temperature 99° C.
(b-2) m-LLDPE: LL-XUMN (Futamura Chemical), thickness 40 μm, TMA softening temperature 109° C.
(b-3) m-LLDPE: UL-1 (Tamapoly), thickness 40 μm, TMA softening temperature 107° C.
(b-4) m-LLDPE: HR653 (KF Film), thickness 30 μm, TMA softening temperature 112° C.
(b-5) m-LLDPE: SE620M (Tamapoly), thickness 40 μm, TMA softening temperature 110° C.
(b-6) m-LLDPE: Umerit 2040F (Ube Maruzen Polyethylene), TMA softening temperature 104° C.
(b-7) m-LLDPE: Evolue SP3010 (Prime Polymer), TMA softening temperature 116° C.
(b-8) m-LLDPE: Umerit 0520F (Ube Maruzen Polyethylene), TMA softening temperature 95° C.
(b-9) m-LLDPE: Excellen FX CX1001 (Sumitomo Chemical), TMA softening temperature 97° C.

The TMA softening temperature measuring conditions are as follows.
Compliant with JIS K-7196
Device: TMA/SS6600 (SII NanoTechnology)
Probe diameter: 1.0 mmϕ
Nitrogen atmosphere
Temperature increase rate: 5° C./min (Resin of the Heat Seal Layer (C))
(c-1) Acrylic resin: Dianal BR-113 (Mitsubishi Rayon), glass transition temperature 75° C.
(c-2) Acrylic resin: Dianal BR-116 (Mitsubishi Rayon), glass transition temperature 50° C.
(Inorganic Filler Added to Heat Seal Layer (C))
(c-3) Inorganic filler: MEK-ST-ZL (Nissan Chemical Industries), silica filler, median size (D50) 100 nm
(Resin of Peel Layer (D))
(d-1) Resin: Tuftec H1041 (Asahi Kasei Chemicals), hydrogenated styrene-butadiene-styrene triblock copolymer (SEBS) resin, styrene proportion 30 mass %, density 0.914
(d-2) Resin: Tuftec H1051 (Asahi Kasei Chemicals), hydrogenated styrene-butadiene-styrene triblock copolymer (SEBS) resin, styrene proportion 42 mass %, density 0.894
(d-3) Resin: Septone 8007 (Kuraray), hydrogenated styrene-isoprene-styrene triblock copolymer (SEPS) resin, styrene proportion 30 mass %, density 0.914
(d-4) Resin: Septone 2007 (Kuraray), hydrogenated styrene-isoprene-styrene triblock copolymer (SEPS) resin, styrene proportion 30 mass %, density 0.912
(Conductive Material Added to Peel Layer (D))
(d-5) Conductive filler: FSS-10T (Ishihara Sangyo), acicular antimony-doped tin oxide, number-average length 2 μm, toluene dispersion type
(d-6) Conductive filler: SNS-10T (Ishihara Sangyo), spherical antimony-doped tin oxide, median size (D50) 100 nm, toluene dispersion type Example 1

After coating the surface of a biaxially stretched polyester film of thickness 12 μm with a polyester anchor coating by means of a gravure process, a film of thickness 40 μm consisting of [(b-1) m-LLDPE] polymerized by a metallocene catalyst was formed by dry lamination, resulting in a laminated film consisting of a biaxially stretched polyester layer and a m-LLDPE layer. The m-LLDPE surface of this film was subjected to a corona treatment. Next, a mixture obtained by adding 300 parts by mass of an antimony-doped tin oxide dispersion [(d-5) conductive filler] to 100 parts by mass of [(d-1) SEBS resin] dissolved in cyclohexane was coated onto the corona-treated intermediate layer side surface of the laminated film to a dry thickness of 0.4 μm by a gravure process to form a peel layer. The surface of the coated peel layer was further coated with a solution obtained by dissolving a random copolymer of butyl methacrylate and methyl methacrylate [(c-1) acrylic resin] and 50 parts by mass of [(c-3) inorganic filler] in MEK to a dry thickness of 0.8 μm as a heat seal layer, to form a cover film for a carrier tape having anti-static properties.

Examples 2, 3 and 6-8

A cover film was prepared in the same way as Example 1, except that the intermediate layer, peel layer and heat seal layer were formed using the raw materials such as resins shown in Table 1 and Table 2.

Comparative Example 1

A cover film was prepared in the same way as Example 1, except that a peel layer and a heat seal layer were sequentially formed on a substrate layer of thickness 50 μm, without providing an intermediate layer.

Comparative Example 2

A cover film was prepared in the same way as Example 1, except that the intermediate layer and peel layer were formed using the raw materials such as resins shown in Table 2, without providing a heat seal layer.

Example 4

A resin consisting of [(b-6) m-LLDPE 6] polymerized by a metallocene catalyst was extruded from a T-die to obtain a film of thickness 40 μm. The surface of a biaxially stretched polyester film of thickness 12 μm was coated with an anchor coating, then the film of thickness 40 μm consisting of [(b-6) m-LLDPE 6] which was extruded beforehand was laminated by dry lamination, to obtain a laminated film consisting of a biaxially stretched polyester layer and a m-LLDPE layer. The m-LLDPE surface of this film was subjected to a corona treatment. Next, a mixture obtained by adding 300 parts by mass of an antimony-doped tin oxide dispersion [(d-5) conductive filler] to 100 parts by mass of [(d-1) SEBS resin] dissolved in cyclohexane was coated onto the corona-treated intermediate layer side surface of the laminated film to a dry thickness of 0.4 μm by a gravure process to form a peel layer. The surface of the coated peel layer was further coated with a solution obtained by dissolving a random copolymer of butyl methacrylate and methyl methacrylate [(c-1) acrylic resin] and 50 parts by mass of [(c-3) inorganic filler] in MEK to a dry thickness of 0.8 μm as a heat seal layer, to form a cover film for a carrier tape having anti-static properties.

Example 5

A cover film for carrier tape was obtained in the same manner as Example 4, except that no conductive filler was included in the peel layer.

Comparative Examples 3-7

A cover film was prepared in the same way as Example 4, except that the intermediate layer, peel layer and heat seal layer were formed using the raw materials such as resins shown in Table 2.
(Evaluation Method)
The evaluations described below were performed on cover films for carrier tape of electronic components prepared according to the examples and comparative examples. The results are shown together in Table 1 and Table 2.
(1) Haze
The haze was measured using an integrating sphere type measuring device in accordance with measuring method A of JIS K7105:1998. Samples that had very poor film forming ability and did not result in a film and therefore were not able to be evaluated as to their haze were recorded as "unevaluated". The results are shown in the rows labeled "Haze" in Table 1 and Table 2.
(2) Sealability
A taping machine (Shibuya Kogyo ETM-480) was used to heat-seal an 8 mm wide polycarbonate carrier tape (Denki Kagaku Kogyo) and polystyrene carrier tape (Denki Kagaku Kogyo) with a 5.5 mm wide cover film with a sealing head width of 0.5 mm×2, a sealing head length of 32 mm, a sealing pressure of 0.1 MPa, a feed length of 4 mm, and a sealing time of 0.1 seconds×8 times, with a sealing iron temperature of 140° C. to 190° C. at 10° C. intervals. After letting stand for 24 hours in an atmosphere of temperature 23° C. and relative humidity 50%, the cover film was peeled at a speed of 300 mm per minute and a peel angle of 170° to 180° in the same atmosphere of temperature 23° C. and relative humidity 50%. Those having an average peel strength in the region from 0.3 to 0.9 N when heat sealed at sealing iron temperatures of 140° C. to 190° C. at 10° C. intervals were rated "excellent", those having some sealing iron temperatures at which the average peel strength is in the region of 0.3 to 0.9 N but having an average peel strength outside the region of 0.3 to 0.9 N when heat sealed at sealing iron temperatures of 140° C. to 190° C. at 10° C. intervals were rated "good", and those in which the average peel strength did not enter the region of 0.3 to 0.9 N at any sealing iron temperature were rated "poor". The results are shown in the rows labeled "Sealability" in Table 1 and Table 2.
(3) Variation in Peeling
Heat sealing was performed so as to have a peel strength of 0.4 N with respect to polystyrene carrier tape (Denki Kagaku Kogyo). The cover film was peeled under the same conditions as in (2) Sealability above. The variation in peel strength was derived from a chart obtained when peeling 100 mm of cover film in the peel direction. Those having a variation in peel strength of 0.2 N or less were rated "excellent", those having a variation of 0.2 to 0.4 N were rated "good", those having a variation greater than 0.4 N were rated "poor", and those in which the peel strength did not reach 0.4 N were recorded as "unevaluated". The results are shown in the rows labeled "Peel Variation" in Table 1 and Table 2.
(4) Rupture Resistance of Cover Film
Heat sealing was performed so as to have a peel strength of 1.0 N with respect to polystyrene carrier tape (Denki Kagaku Kogyo). The cover film was peeled under the same conditions as in (2) Sealability above. The carrier tape sealed by the cover film was cut into lengths of 550 mm, then the bottom portions of the pockets in the carrier tape were adhered to a vertical wall taped with double-sided adhesive tape. 50 mm of the cover film was peeled from the top portions of the adhered carrier tape, the cover film was clamped with a clip, and a weight of mass 1000 g was attached to the clip. Then, after allowing the weight to naturally drop, those in which the cover film did not rupture even once among 50 samples were rated "excellent", those in which the cover film ruptured in 1 to 5 of 50 samples were rated "good", and those in which 5 or more samples ruptured were rated "poor". Additionally, those in which the peel strength never reached 1.0 N in the evaluation of (2) Sealing Property were recorded as "unevaluated". The results are shown in the rows labeled "Film Rupture Resistance" in Table 1 and Table 2.
(5) Surface Resistivity
A Mitsubishi Chemical Hiresta UP MCP-HT450 was used to measure the surface resistivity of the heat seal layer surface at an atmospheric temperature of 23° C., atmospheric humidity 50% RH and applied voltage 10 V using the method of JIS K6911. The results are shown in the rows labeled "Surface Resistivity" in Table 1 and Table 2.

TABLE 1

| | Type of Resin | | Ex 1 | Ex 2 | Ex 3 | Ex 4 | Ex 5 | Ex 6 | Ex 7 | Ex 8 |
|---|---|---|---|---|---|---|---|---|---|---|
| Intermediate Layer | m-LLDPE | b-1 LL-UL | 100 | | | | | | | |
| | m-LLDPE | b-2 LL-XUMN | | 100 | | | | | | |
| | m-LLDPE | b-3 UL-1 | | | 100 | | | | | |
| | m-LLDPE | b-4 HR653 | | | | | | | | |

TABLE 1-continued

| | | Type of Resin | | Ex 1 | Ex 2 | Ex 3 | Ex 4 | Ex 5 | Ex 6 | Ex 7 | Ex 8 |
|---|---|---|---|---|---|---|---|---|---|---|---|
| | m-LLDPE | b-5 | SE620M | | | | | | | | |
| | m-LLDPE | b-6 | Umerit 2040F | | | | 100 | 100 | | | |
| | m-LLDPE | b-7 | Evolue SP3010 | | | | | | | | |
| | m-LLDPE | b-8 | Umerit 0520F | | | | | | | | |
| | m-LLDPE | b-9 | Excellen FX CX1001 | | | | | | | | |
| Peel Layer Blend | Resin (SEBS) | d-1 | Tuftec H1041 | 100 | 100 | 100 | 100 | 100 | | | |
| | Resin (SEBS) | d-2 | Tuftec H1051 | | | | | | 100 | | |
| | Resin (SEPS) | d-3 | Septone 8007 | | | | | | | 100 | |
| | Resin (SEPS) | d-4 | Septone 2007 | | | | | | | | 100 |
| | Conductive Filler | d-5 | FSS-10T | 300 | | 300 | 300 | | 300 | 300 | 300 |
| | Conductive Filler | d-6 | SNS-10T | | 800 | | | | | | |
| Heat Seal Layer Blend | Acrylic Resin | c-1 | Dianal BR-113 | 100 | 100 | 100 | 100 | 100 | 100 | | |
| | Acrylic Resin | c-2 | Dianal BR-116 | | | | | | | 100 | 100 |
| | Inorganic Filler | c-3 | MEK-ST-ZL | 50 | 50 | 60 | 20 | 20 | 50 | 50 | 10 |
| Evaluated Physical Properties etc. | Substrate thickness; μm | | | 12 | 12 | 12 | 12 | 12 | 12 | 12 | 12 |
| | Intermediate layer thickness; μm | | | 40 | 40 | 40 | 40 | 40 | 40 | 40 | 40 |
| | Primer layer thickness; μm | | | 0.4 | 0.3 | 0.6 | 0.4 | 0.8 | 0.4 | 0.4 | 0.4 |
| | Heat seal layer thickness; μm | | | 0.8 | 0.8 | 0.8 | 0.8 | 0.8 | 0.8 | 1 | 1 |
| | Cover film thickness; μm | | | 53.2 | 53.1 | 53.4 | 53.2 | 53.6 | 53.2 | 53.4 | 53.4 |
| | (1) Haze; % | | | 10 | 30 | 10 | 9 | 9 | 10 | 10 | 10 |
| | (2) Sealability | 1 | to polycarbonate tape | excellent | excellent | excellent | excellent | excellent | excellent | excellent | excellent |
| | | 2 | 1 to polystyrene tape | excellent | excellent | excellent | excellent | good | excellent | excellent | excellent |
| | (3) Variation in peel strength | | | excellent | excellent | excellent | excellent | good | excellent | excellent | excellent |
| | (4) Cover film rupture resistance | | | excellent | excellent | excellent | excellent | excellent | excellent | excellent | excellent |
| | (5) Surface resistivity; Ω | | | 1.E+08 | 2.E+08 | 5.E+08 | 1.E+08 | >1.E+12 | 1.E+08 | 1.E+08 | 1.E+08 |

TABLE 2

| | | Type of Resin | | Co Ex 1 | Co Ex 2 | Co Ex 3 | Co Ex 4 | Co Ex 5 | Co Ex 6 | Co Ex 7 |
|---|---|---|---|---|---|---|---|---|---|---|
| Intermediate Layer | m-LLDPE | b-1 | LL-UL | | 100 | | | | | |
| | m-LLDPE | b-2 | LL-XUMN | | | | | | | |
| | m-LLDPE | b-3 | UL-1 | | | | | | | |
| | m-LLDPE | b-4 | HR653 | | | 100 | | | | |
| | m-LLDPE | b-5 | SE620M | | | | 100 | | | |
| | m-LLDPE | b-6 | Umerit 2040F | | | | | | | |
| | m-LLDPE | b-7 | Evolue SP3010 | | | | | 100 | | |
| | m-LLDPE | b-8 | Umerit 0520F | | | | | | 100 | |
| | m-LLDPE | b-9 | Excellen FX CX1001 | | | | | | | 100 |
| Peel Layer Blend | Resin (SEBS) | d-1 | Tuftec H1041 | 100 | 100 | 100 | 100 | 100 | 100 | 100 |
| | Resin (SEBS) | d-2 | Tuftec H1051 | | | | | | | |
| | Resin (SEPS) | d-3 | Septone 8007 | | | | | | | |
| | Resin (SEPS) | d-4 | Septone 2007 | | | | | | | |
| | Conductive Filler | d-5 | FSS-10T | 300 | 300 | 300 | 300 | 300 | 300 | 300 |
| | Conductive Filler | d-6 | SNS-10T | | | | | | | |
| Heat Seal Layer Blend | Acrylic Resin | c-1 | Dianal BR-113 | 100 | | 100 | 100 | 100 | | |
| | Acrylic Resin | c-2 | Dianal BR-116 | | | | | | 100 | 100 |
| | Inorganic Filler | c-3 | MEK-ST-ZL | 50 | | 20 | 20 | 50 | 50 | 10 |
| Evaluated Physical Properties etc. | Substrate thickness; μm | | | 50 | 12 | 12 | 12 | 12 | 12 | 12 |
| | Intermediate layer thickness; μm | | | 0 | 40 | 40 | 40 | 40 | 40 | 40 |
| | Primer layer thickness; μm | | | 0.4 | 0.6 | 0.4 | 0.8 | 0.4 | 0.4 | 0.4 |
| | Heat seal layer thickness; μm | | | 0.8 | 0 | 0.8 | 0.8 | 0.8 | 1 | 1 |
| | Cover film thickness; μm | | | 51.2 | 52.6 | 53.2 | 53.6 | 53.2 | 53.4 | 53.4 |
| | (1) Haze; % | | | 10 | 10 | 9 | 9 | 10 | 10 | 10 |
| | (2) Sealability | 1 | 1 to polycarbonate tape | poor | good | good | good | good | good | excellent |
| | | 2 | 1 to polystyrene tape | poor | good | good | good | good | good | excellent |
| | (3) Variation in peel strength | | | poor | good | poor | poor | poor | poor | poor |
| | (4) Cover film rupture resistance | | | unevaluated | poor | excellent | excellent | excellent | excellent | poor |
| | (5) Surface resistivity; Ω | | | 1.E+08 | 5.E+07 | 1.E+08 | 1.E+08 | 1.E+08 | 1.E+08 | 1.E+08 |

DESCRIPTION OF THE REFERENCE NUMBERS 1 cover film
2 substrate layer
3 anchor coating layer
4 intermediate layer
5 peel layer
6 heat seal layer

The invention claimed is:

1. A cover film comprising at least:
   a substrate layer,
   an intermediate layer,
   a heat seal layer comprising a thermoplastic resin capable of heat sealing to carrier tape, and
   a peel layer between the intermediate layer and the heat seal layer, wherein
   the intermediate layer comprises a metallocene linear low-density polyethylene,
   the metallocene linear low-density polyethylene has a softening temperature of 98 to 109° C. by a TMA method according to JIS K7196, and
   the peel layer comprises a hydrogenated automatic vinyl-conjugated diene copolymer resin that has an aromatic vinyl group content of 15 to 35 mass % with respect to 100 mass % for the entire resin, and a density if $0.890 \times 10^3$ to $0.935 \times 10^3$ (kg/m$^3$).

2. The cover film according to claim 1, wherein one of the heat seal layer or the peel layer comprises a conductive material.

3. The cover film according to claim 2, wherein the conductive material is conductive microparticles, in the form of either acicular or spherical microparticles, or a combination thereof.

4. An electronic component package using the cover film according to claim 1 as the lid material for a thermoplastic resin carrier tape.

5. The cover film according to claim 2, wherein the heat seal layer comprises a conductive material.

6. The cover film according to claim 5, wherein
   the heat seal layer comprises at least one of conductive tin oxide particles, conductive zinc oxide particles, or conductive titanium oxide particles that are conductive fillers, and
   the peel layer comprises at least one of talc particles, silica particles, alumina particles, mica particles, calcium carbonate, or magnesium carbonate.

* * * * *